United States Patent [19]

Basile

[11] 4,097,843
[45] Jun. 27, 1978

[54] WARNING DEVICE AND RECEPTACLE ADAPTOR

[76] Inventor: Sebastian B. Basile, 20 Coutant Dr., New Rochelle, N.Y. 10804

[21] Appl. No.: 741,506

[22] Filed: Nov. 12, 1976

[51] Int. Cl.² ............................................. G08B 13/02
[52] U.S. Cl. ................................... 340/280; 200/51.1
[58] Field of Search ........... 340/248 R, 248 B, 253 B, 340/253 C, 256, 280; 200/51.09, 51.1, 50 B, 61.59

[56] References Cited

U.S. PATENT DOCUMENTS

| 2,931,019 | 3/1960 | Walters | 340/253 C |
| 3,192,518 | 6/1965 | Sliman | 340/280 |
| 3,537,095 | 10/1970 | Cones | 340/280 |
| 3,596,019 | 7/1971 | Koester | 200/51.09 |
| 3,794,989 | 2/1974 | Manley et al. | 340/280 |
| 4,009,474 | 2/1977 | Eller | 340/280 |

Primary Examiner—Alvin H. Waring
Attorney, Agent, or Firm—Paul R. Audet

[57] ABSTRACT

A warning device, and a receptacle adaptor, the former being connectable between an electrical appliance and power source, for warning of a power interruption to the appliance, and including the receptacle adaptor having a reciprocable spring-biased pin in a channel, communicable with a micro-switch and an appliance plug grounding prong, for activating an alarm when the prong is withdrawn from the channel.

5 Claims, 4 Drawing Figures

WARNING DEVICE AND RECEPTACLE ADAPTOR

This invention relates to warning devices. More particularly, this invention is directed to a warning device which gives an alarm when an electrical unit or appliance is not getting electrical power from a source. The invention is also directed to a receptacle adaptor for activating the alarm of the warning device when an electrical unit or appliance plug having a grounding prong is pulled from the receptacle adaptor.

There is a need for an inexpensive, easy to operate, easy to manufacture, dual function warning device which will warn not only of an electrical power failure but also of a disconnection between an electrical unit or appliance and an electrical power source.

It is therefore an object of this invention to provide the aforementioned dual function warning device.

It is another object of this invention to provide a warning device which has a receptacle adaptor into which a grounded type plug of an electrical unit or appliance can be plugged, which can be plugged into a conventional wall receptacle, and which will give a warning or an alarm in case of a loss of electrical power at the wall receptacle, or a disconnection between the warning device and the wall receptacle, or between it and the electrical unit or appliance.

Another object of this invention is to provide the aforementioned warning devices wherein the alarm can be either visual or audio.

Another object of this invention is to provide an aforementioned warning device having auxiliary means for activating one or more auxiliary alarm systems when an electrical unit or appliance plug is not receiving electrical power from a source.

Still another object of this invention is to provide a receptacle adaptor having means for receiving a grounded type plug of an electrical unit or appliance, and having means responsive to withdrawal of the grounded plug therefrom, for activating an alarm upon such withdrawal.

DETAILED DESCRIPTION OF THE DRAWINGS

Figure 1:
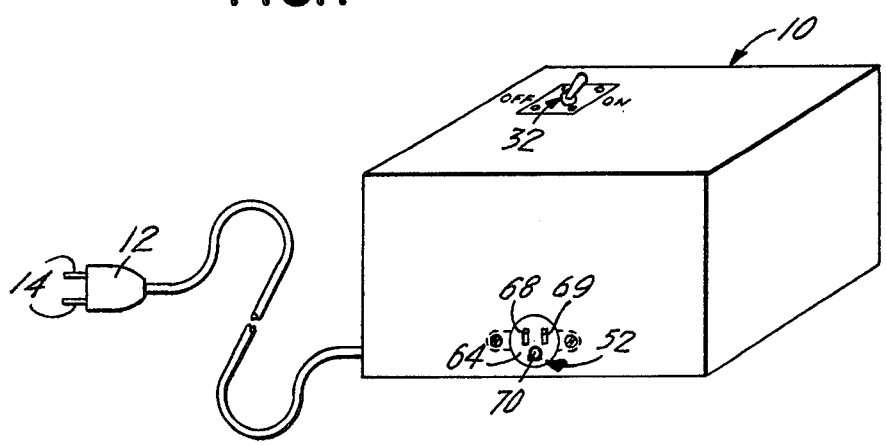
FIG. 1 is a perspective view of the warning device of this invention.

Referring to the drawings in detail, FIG. 1 shows a warning device, generally designated 10, for indicating loss of power to an electrical unit or appliance (not shown) from a power source, by power failure or disengagement of a plug between the electrical unit or appliance and a power source, for example an electrical outlet. More particularly, FIG. 1 shows that warning device 10 has connected thereto, means such as an electrical plug 12 having prongs 14 for connecting relay switch 22 (FIG. 2) across a power source, such as by insertion into a power source receptacle such as a conventional convenience outlet or wall receptacle WR of a 110 volt A.C. electrical circuit. Warning device 10 also includes a receptacle adaptor 52 for receiving the blades and grounding prong of an electrical unit or appliance plug (FIG. 2), and an on-off switch, generally designated 32, for activating and de-activating the alarm means of the warning device in a manner to be explained.

Figure 2:
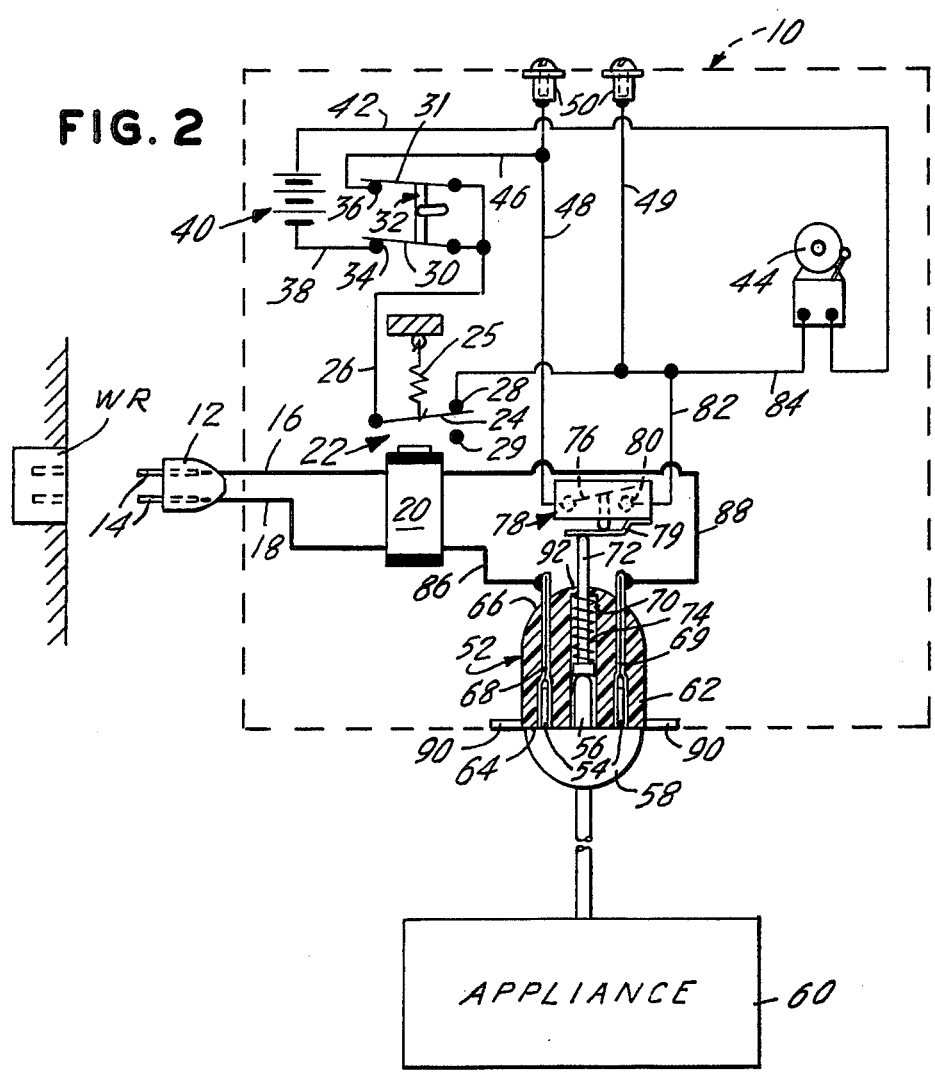
FIG. 2 is a schematic diagram showing one mode of operation of the electrical circuit which forms part of the present invention.

As shown in FIG. 2, each of prongs 14 of plug 12 are connected through leads 16,18 to coil 20 of relay switch 22, whose blade 24 is spring-biased by spring 25 toward and against its contact 28 when, as shown, coil 20 is not energized, and which is drawn away from the contact and held toward the coil, such as against stop 29, when the coil is energized, as when plug 12 is inserted into a wall receptacle. Blade 24 is connected by lead 26 to contact arms 30,31 of on-off switch 32, preferably a suitable double pole, single throw switch. Contact arms 30,31 are shown closed against poles 34,36. Pole 34 is connected through lead 38 to one terminal of a suitable battery 40, for example, a six volt battery, whose other pole is connected through lead 42 to suitable alarm means such as bell 44. Pole 36 is connected through lead 46 to one lead, 48, of an auxiliary terminal 50, whose use will be described later.

Warning device 10 is provided with a receptacle adaptor, shown in cross-section and generally designated 52, for receiving blades 54 and grounding prong 56 of grounded plug 58 of, and connected by a cord to, for example an electrical unit or appliance 60. Receptacle adaptor 52 includes a housing 62 having respective front and back surfaces 64,66, spaced parallel contact members 68 and 69 extending into the housing from front surface 64 for receiving plug blades 54, channel 70 parallel to contact members 68,69 and extending through housing 62 from its front surface to its back surface, for receiving grounding prong 56, pin 72 having a front end and a back end, mounted in channel 70 for reciprocating axially therethrough, and biasing means, for example, spring 74, in engagement with pin 72 and which can be fixedly connected by any suitable means to the housing, but preferably frictionally engages the wall of and is frictionally held within channel 70, for biasing pin 72 toward front surface 64 in a manner that allows the tip of grounding prong 56 to come into engagement with the pin front end when the grounding prong is inserted into the front end of channel 70. Preferably, the back end of pin 72 is beyond rear surface 66. When the tip of grounding prong 56 engages pin 72, the pin, channel and spring allow pin 72 to be moved against the bias of spring 74 through channel 70 to an extent that the pin back end, farthest from grounding prong 56, is axially further back than it was when the pin was in its biased position, and to an extent that the back end of pin 72 extends sufficiently beyond housing rear surface 66 that the pin back end communicates with and operates a second switch, preferably a microswitch, generally designated 78, and keeps the switch open as long as grounding prong 56 and blades 54 are electrically connected by insertion into receptacle adaptor 52. As shwon, the micro-switch includes means such as a leaf spring 79 for rendering pin 72 communicable with a micro-switch contactor 76. Communication between the back end of pin 72 and micro-switch 78 is effected by contact of the pin with the micro-switch leaf spring which, when thrust inward by pin 72, opens contactor 76 relative to contact 80. Contactor 76 is connected to lead 48 which forms one pole of auxiliary terminal 50. Contact 80 of second switch 78 is connected through lead 82 to lead 84 which has one end connected to bell 44 and its other end connected to relay switch contact 28. Lead 49 is connected at one end to lead 84 and its other end forms the second pole of auxiliary terminal 50. Lead 86 is connected at one end through relay switch 22 to plug lead 18, and at its other end to contact member 68 of receptacle adaptor 52. The other contact member 69 is connected by lead 88 through relay switch 22 to the other lead, 16, of plug 12.

The circuit of FIG. 2 shows that when there has been an interruption or loss of power to warning device 10, either due to a power failure of the 110 volt A.C. circuit, for example, due to storm damage to residential power lines, or due to plug 12 being disconnected from the power source, coil 20, which was energized and held blade 24 against stop 29 while power was flowing to the device, becomes de-energized. This releases blade 24 which is spring-biased against contact 28. When switch 32 is in the "ON" position, its contacts are closed as shown in FIG. 2 such that with the spring-biased closing of blade 24 against contact 28, a circuit is completed between battery 40 and bell 44. This energizes the bell and provides a warning that there is a power interruption or loss and that the electrical unit or appliance connected to warning device 10 is not receiving power. This warning is advantageous especially with respect to power failures which people are otherwise unaware of, for example, those which occur during the night while people are asleep or away from their homes. In the latter instance, an auxiliary alarm system such as a tape recorder which when activated will ring a telephone at a prerecorded number and transmit a prerecorded message via the telephone, can be connected to auxiliary terminal 50 connected between the on-off switch and bell, such that when the bell is activated, a homeowner can be simultaneously warned by answering the telephone at the prerecorded number. This warning allows an alternative power supply to be connected to and supply power to the appliance until the main power supply is restored thereto. If the main source of power is restored, and/or warning device plug 12 is reconnected into the wall receptacle, whichever or both had caused the power loss, coil 20 will be energized, blade 24 will be drawn against stop 29, the circuit between the battery 40 and bell 44 will be opened and bell 44 will be de-energized. Bell 44 can also be de-energized by moving switch 32 to its "OFF" position which opens blades 30,31 from contacts 34,36. To ready the warning device to provide another warning, switch 32 is moved to the "ON" position.

Figure 3:
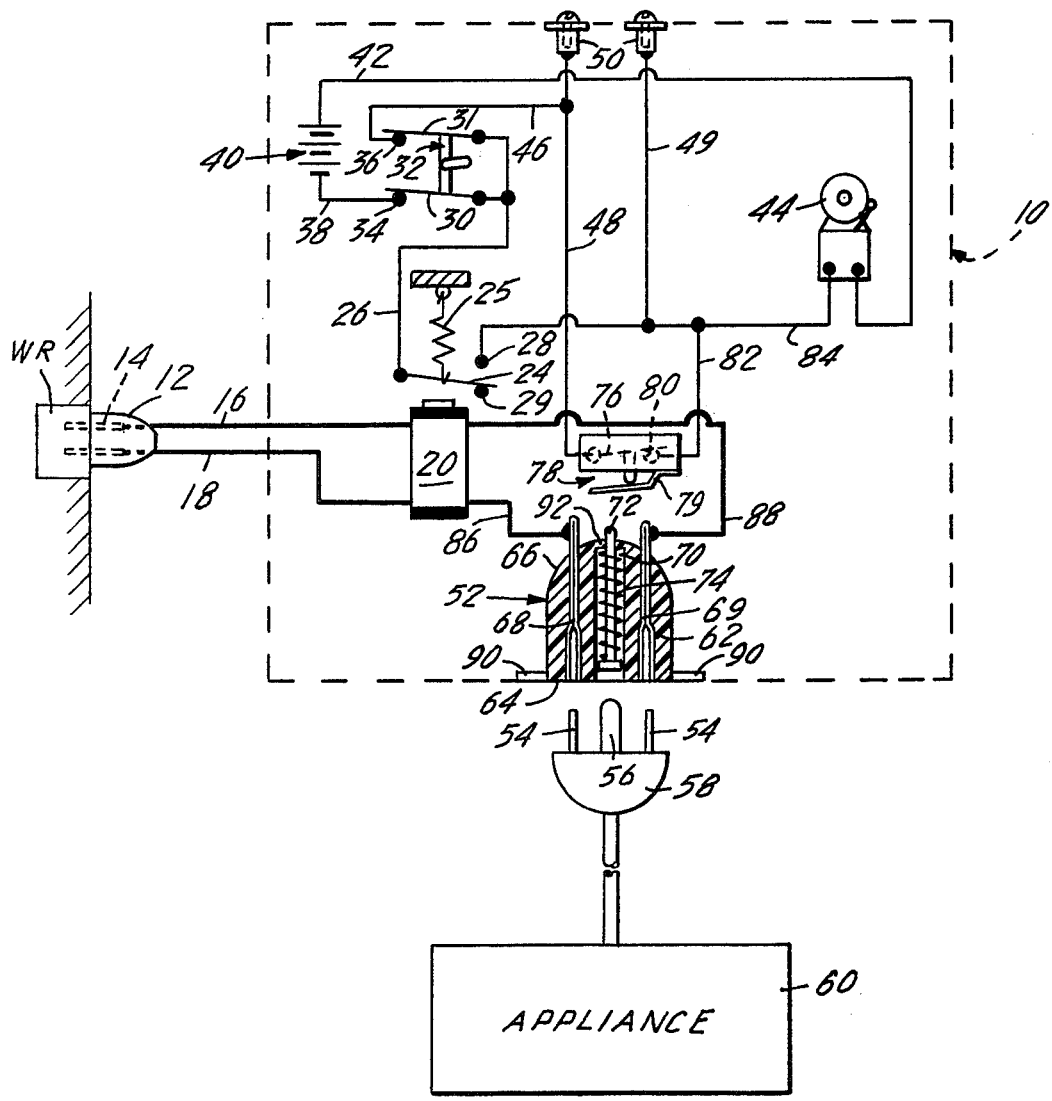
FIG. 3 is a schematic diagram showing another mode of operation of the electrical circuit of FIG. 2.

FIG. 3 shows the mode of operation of the circuit of FIG. 2 when plug 12 is connected into and receiving power through a wall receptacle and grounded plug 58 is disconnected from receptacle adaptor 52 and therefore warning device 10. When grounded plug 58 is removed from receptacle adaptor 52, plug grounding prong 56 is removed from receptacle adaptor channel 70, spring 74 axially moves pin 72 back to its spring-biased position. This action breaks the contact between pin 72 and leaf spring 79, and the movement of leaf spring 79 back to its biased position draws contactor 76 against contact 80 and closes a circuit between battery 40 and bell 44. Current flows from battery 40 through lead 42 to bell 44 which is connected to the battery through leads 84,82, contact 80, contactor 76, leads 48,46, contact 36, blade 30, contact 34 and lead 38. As previously mentioned, on-off switch 32 can be moved to its "OFF" position to open the previously described circuit and thereby de-energize bell 44. If switch 32 is left at its "ON" position and plug 58 is again connected to receptacle adaptor 52, blade 76 will be opened from contact 80 and bell 44 will be de-energized or deactivated and power will flow through plug 12, leads 16,18, coil 20, leads 86,88, contact members 68,69 of a receptacle adaptor 52 and to blades 54 and appliance 60. Switch 32 must be at the "ON" position so that bell 44 will be activated both when power is lost or interrupted and does not flow to relay switch 22, as exemplified by FIG. 2, and when a grounded plug of an electrical unit or appliance is disconnected from and its grounding prong is removed from receptacle adaptor 52.

Figure 4:
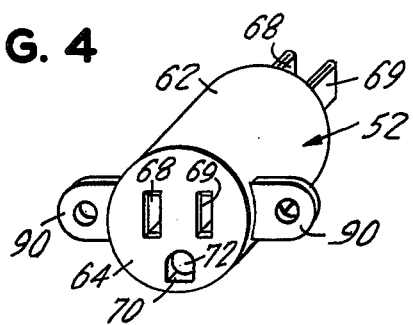
FIG. 4 is a perspective view of the receptacle adaptor of this invention.

FIG. 4, a perspective view of receptacle adaptor 52, shows its housing 62 having contact members 68,69 and channel 70 extending into its front surface 64. The head of pin 72 is shows within channel 70. Receptacle adaptor 52 can have suitable means such as conventional mounting ears 90 having holes therein, for mounting the receptacle adaptor within warning device 10. As shown in FIGS. 2 and 3, housing 62 preferably has suitable means, for example, channel lip 92 at the rear surface of the housing, for maintaining pin 72 guiding the rear portion of the pin within channel 70.

It is thought that the inventions and many of their attendant advantages will be understood from the foregoing description, and it is apparent that various changes may be made in the form, construction, and arrangement of the parts, without departing from the spirit and scope of the invention or sacrificing all of its material advantages, the articles hereinbefore described being merely preferred embodiments thereof.

I claim:

1. A warning device for indicating loss of power to an electrical unit from a power source by power failure or by disengagement of a plug between the electrical unit and power source, which comprises:
   a relay switch having a coil and a spring-biased blade which moves to and from a contact, and is biased against the contact and drawn away from the contact and held toward the coil when the coil is energized,
   means connected to the relay switch for connecting the relay switch across a power source,
   a receptacle adaptor for receiving the blades and grounding prong of a grounded plug, including
   a housing having front and back surfaces,
   contact members extending into the housing from its front surface for receiving the grounded plug blades,
   a channel pin the housing for receiving the plug grounding prong, the channel extending through the housing from its front to back surfaces,
   a pin having a front end and a back end, mounted in the channel for reciprocating axially therethrough, and
   biasing means pin engagement with the channel and pin for biasing the in toward the front surface in a manner that allows the tip of the plug grounding prong to come into engagement with the pin front end when a prong is inserted into the channel, and allows the pin to be thereby moved against the bias axially through the channel to an extent that the pin back end extends beyond the housing rear surface,
   a second switch connected to the relay contact, the second switch having a contactor and means for rendering the pin communicable with the contactor, such that the second switch is closed when the grounding prong is removed from the receptacle channel and the pin is moved axially to its spring-biased position, and an on-off switch having two poles, one pole being connected to the relay blade, for activating and de-activating the warning device, a battery having one pole connected to the other pole of the on-off switch, and alarm means connected between the on-off switch and the battery, and between the battery and the on-off and second switches, said alarm means being activated when power to the relay is lost or when the grounding prong is withdrawn from the receptacle adaptor.

2. The warning device of claim 1 wherein the device includes an auxiliary terminal connected between the on-off switch and alarm means for activating an auxiliary alarm system when the alarm means is activated.

3. The warning device of claim 1 wherein the biasing means is a spring.

4. A receptacle adaptor for receiving the blades and grounding prong of a grounded plug, comprising:
a housing having front and back surfaces,
contact members extending into the housing from its front surface for receiving the grounded plug blades,
a channel in the housing for receiving the plug grounding prong, the channel extending through the housing from its front to back surfaces.
a pin having a front end and a back end, mounted in the channel for reciprocating axially therethrough, and
biasing means in engagement with the channel and pin for biasing the pin toward the front surface in a manner that allows the tip of the plug grounding prong to come into engagement with the pin front end when a prong is inserted into the channel, and allows the pin to be thereby moved against the bias axially through the channel to an extent that the pin back end extends beyond the housing rear surface.

5. The receptacle adaptor of claim 4 wherein the biasing means is a spring.

* * * * *